(12) United States Patent
McElfresh et al.

(10) Patent No.: US 9,229,045 B2
(45) Date of Patent: Jan. 5, 2016

(54) IN-SITU CHARACTERIZATION OF A SOLID-STATE LIGHT SOURCE

(75) Inventors: David K. McElfresh, San Diego, CA (US); Dan Vacar, San Diego, CA (US); Leoncio D. Lopez, Escondido, CA (US); Kenny C. Gross, San Diego, CA (US)

(73) Assignee: ORACLE AMERICA, INC., Redwood Shores, CA (US)

( * ) Notice: Subject to any disclaimer, the term of this patent is extended or adjusted under 35 U.S.C. 154(b) by 1309 days.

(21) Appl. No.: 12/269,561

(22) Filed: Nov. 12, 2008

(65) Prior Publication Data

US 2010/0121593 A1    May 13, 2010

(51) Int. Cl.
G01R 31/26    (2014.01)
G01R 19/00    (2006.01)

(52) U.S. Cl.
CPC .................................. *G01R 31/2635* (2013.01)

(58) Field of Classification Search
CPC .................................................. G01R 31/2635
USPC ........................................................... 702/64
See application file for complete search history.

(56) References Cited

U.S. PATENT DOCUMENTS

| | | | |
|---|---|---|---|
| 5,879,301 A * | 3/1999 | Chiabrera et al. | 600/437 |
| 2004/0109629 A1 * | 6/2004 | Kondo | 385/14 |
| 2008/0048951 A1 * | 2/2008 | Naugler et al. | 345/82 |
| 2008/0100561 A1 * | 5/2008 | Price et al. | 345/102 |
| 2008/0140362 A1 * | 6/2008 | Gross et al. | 703/2 |
| 2008/0252481 A1 * | 10/2008 | Vacar et al. | 340/870.38 |

OTHER PUBLICATIONS

Hsin-Hua Lin and Jyh-Jen Horng Shiau, "Analyzing Accelerated Degradation Data by Nonparametric Regression", Jun. 1999, IEEE Transactions on Reliability, vol. 48, pp. 149-158.*

* cited by examiner

*Primary Examiner* — Patrick Assouad
*Assistant Examiner* — Haidong Zhang
(74) *Attorney, Agent, or Firm* — Park, Vaughan, Fleming & Dowler LLP

(57) ABSTRACT

Some embodiments of the present invention provide a system for in-situ characterization of a solid-state light. First, a voltage and a current of the solid-state light source are monitored. Then, the health of the solid-state light source is characterized based on an analysis of the monitored voltage and current.

14 Claims, 6 Drawing Sheets

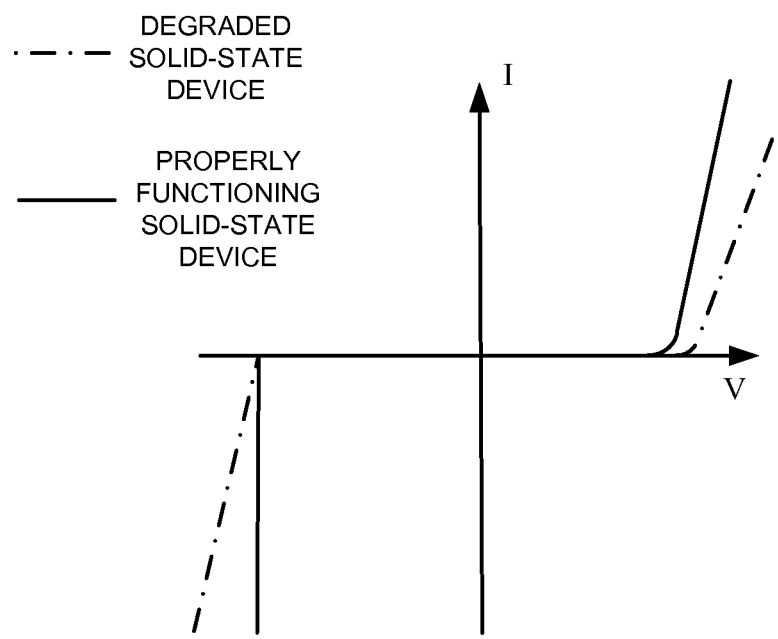
FIG. 3A
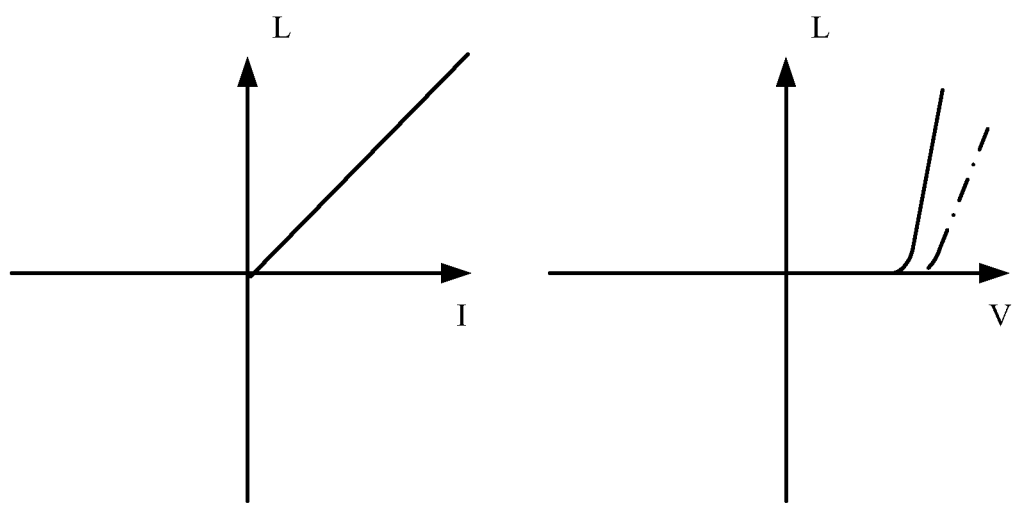
FIG. 3B  FIG. 3C

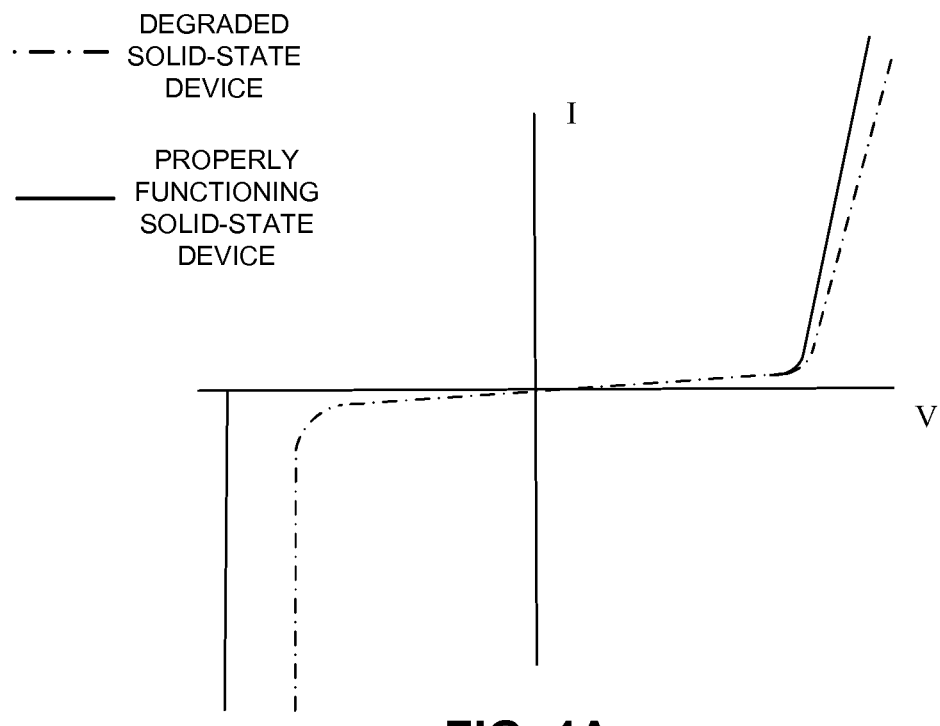
FIG. 4A
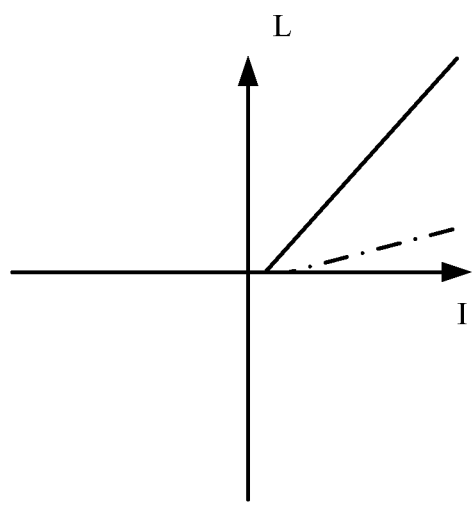 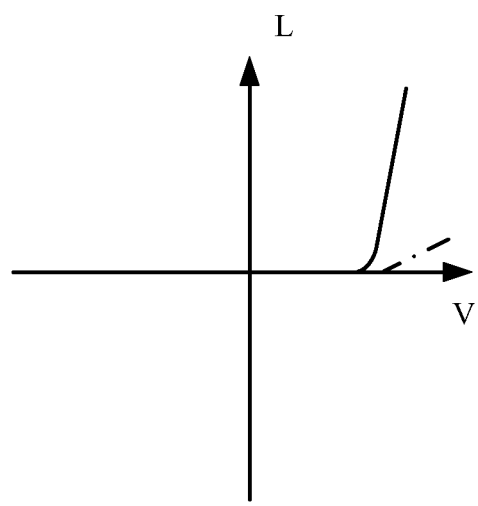
FIG. 4B                    FIG. 4C

IN-SITU CHARACTERIZATION OF A SOLID-STATE LIGHT SOURCE

BACKGROUND

1. Field

The present invention generally relates to techniques for characterizing a solid-state light source. More specifically, the present invention relates to a method and an apparatus for in-situ characterization of a solid-state light source.

2. Related Art

The use of solid-state light sources is becoming more common in electronic products. In particular, solid-state light sources such as vertical cavity surface emitting lasers (VCSEL) are increasingly being used in applications in electronic products that require a higher degree of reliability. However, the reliability of some-solid state light sources can be lower than that of some of the electronic components they are used in. Therefore, it is often desirable to monitor the solid-state light source in order to characterize its health. Directly monitoring the output of a solid-state light source can be difficult since some monitoring method disrupt the output path or cause unwanted feedback that can impact the output of the device. Additionally, in some cases a "canary" solid-state device is installed in a system and its output is monitored as a proxy for the output of other solid-state light sources in the system. However, there is a chance that the monitored device may itself fail before (or after) the other devices in the system, and additionally, the proxy device does not allow for direct monitoring of individual devices in the system as the system is being used.

Hence, what is needed is a method and system for in-situ characterization of a solid-state light source without the above-described problems.

SUMMARY

Some embodiments of the present invention provide a system for in-situ characterization of a solid-state light. First, a voltage and a current of the solid-state light source are monitored. Then, the health of the solid-state light source is characterized based on an analysis of the monitored voltage and current.

In some embodiments, the analysis involves a regression analysis of the monitored voltage and current.

In some embodiments, the regression analysis involves a nonlinear, non-parametric regression analysis of the monitored voltage and current.

In some embodiments, the nonlinear, non-parametric regression analysis includes the use of a multivariate state estimation technique.

In some embodiments, the analysis includes a statistical hypothesis test of the regression analysis.

In some embodiments, characterizing the health of the solid-state light source includes characterizing a likelihood of an impending failure of the solid-state light source.

Some embodiments further include taking remedial action based on the health of the solid-state light source.

Some embodiments further include determining a cause of a failure of the solid-state light source.

In some embodiments, the solid-state light source includes at least one of: a vertical-cavity surface-emitting laser (VCSEL), a light emitting diode, and a semiconductor distributed-feedback laser (DFB).

BRIEF DESCRIPTION OF THE FIGURES

FIG. 3 depicts exemplary graphs of current-voltage relationships and light output versus voltage and versus current for a degraded solid-state light source with a series resistance across the device compared to a properly functioning solid-state light source.

FIG. 4 depicts exemplary graphs of current-voltage relationships and light output versus voltage and versus current for a degraded solid-state light source with a non-radiative defect in or near the p-n junction the device compared to a properly functioning solid-state light source.

DETAILED DESCRIPTION

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present description. Thus, the present description is not intended to be limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Figure 1:
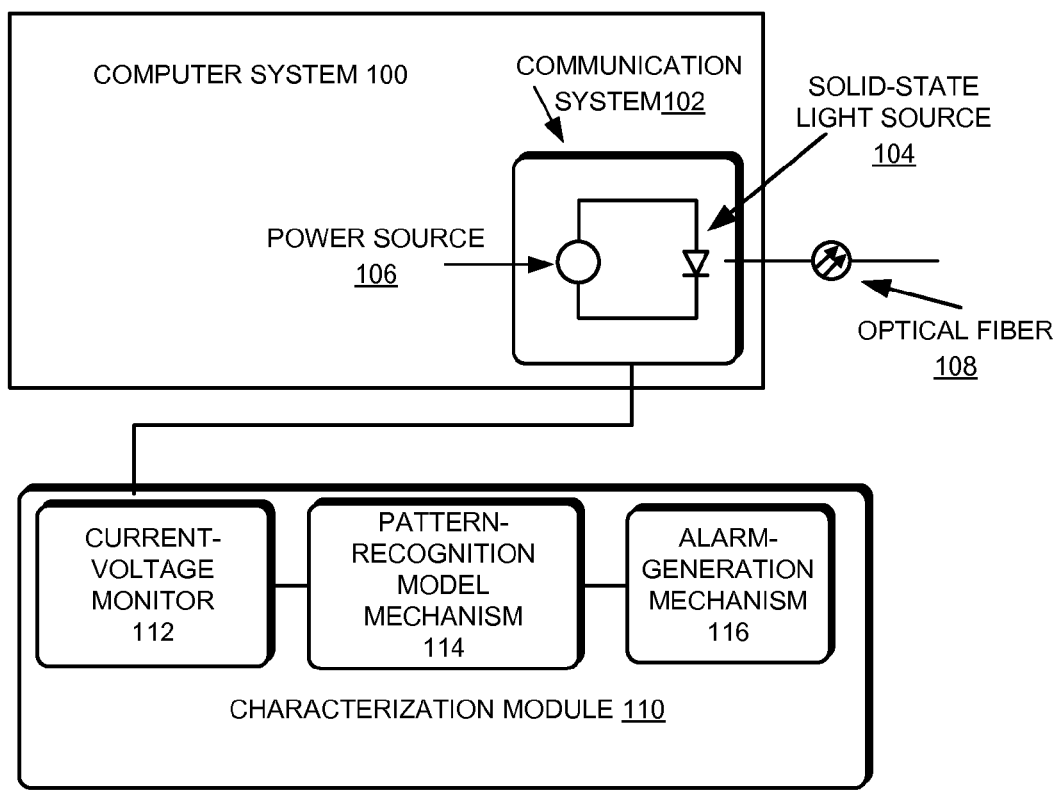
FIG. 1 illustrates a system that performs in-situ characterization of a solid-state light source in accordance with some embodiments of the present invention.

FIG. 1 illustrates a system that performs in-situ characterization of a solid-state light source in accordance with some embodiments of the present invention. Computer system 100 contains communication system 102 which includes solid-state light source 104 powered by power source 106 and coupled to optical fiber 108. Furthermore, communication system 102 is coupled to characterization module 110 which includes current-voltage monitor 112, pattern-recognition model mechanism 114 and alarm-generation mechanism 116.

Computer system 100 can include but is not limited to a personal computer (PC); a server; a client computer communicating with a server through a network such as the Internet; a hand-held computer; a personal digital assistant (PDA), a cell phone, or any other computation system or combination of systems.

Solid-state light source 104 can include any solid-state light source know in the art, including but not limited to a vertical-cavity surface-emitting laser (VCSEL), a semiconductor distributed-feedback laser (DFB), or a light emitting diode (LED). Furthermore, power source 106 can be any power source known in the art that drives solid-state light source 104, including but not limited to a voltage source or a current source. Additionally, power source 106 may also include a mechanism to modulate the power supplied to solid state-light source 104 to impose a signal on the output of solid state light source 104. Note that the output from solid-state light source 106 is coupled into optical fiber 108.

Current-voltage monitor 112 is coupled to communication system 102. During operation, current-voltage monitor 112 receives information from communication system 102 related to the monitored current-voltage (I-V) relationship of the solid-state light source 104. Note that current-voltage monitor 112 can be implemented in any technology and any combination of hardware and software. In some embodiments, current-voltage monitor 112 includes a processor. In some embodiments, current-voltage monitor 112 operates on computer system 100 or on a separate computer system. In some embodiments, current-voltage monitor 112 includes a wired or wireless communications mechanism and/or a connection through the Internet to transfer information including the I-V relationship of solid-state light source 104 monitored by current-voltage monitor 112.

Pattern-recognition model mechanism 114 can be any device that can receive input from current-voltage monitor 112 and implement a pattern-recognition model to generate an estimate of the I-V relationship based on the I-V relationship from current-voltage monitor 112. Note that pattern-recognition model mechanism 114 can implement any pattern-recognition model, including but not limited to nonlinear, non-parametric regression such as a multivariate state estimation technique (MSET), a quadratic classifier, a k-nearest neighbor classifier, or an R-cloud classifier. Furthermore, pattern-recognition model mechanism 114 can be implemented in any combination of hardware and software. In some embodiments, pattern-recognition model mechanism 114 operates on computer system 100. In other embodiments, pattern-recognition model mechanism 114 operates on one or more service processors. In still other embodiments, pattern-recognition model mechanism 114 is located inside computer system 100. In yet other embodiments, pattern-recognition model mechanism 114 operates on a separate computer system.

Note that the term MSET as used in this specification refers to a class of pattern-recognition techniques. For example, see [Gribok]"Use of Kernel Based Techniques for Sensor Validation in Nuclear Power Plants," by Andrei V. Gribok, J. Wesley Hines, and Robert E. Uhrig, The Third American Nuclear Society International Topical Meeting on Nuclear Plant Instrumentation and Control and Human-Machine Interface Technologies, Washington D.C., Nov. 13-17, 2000. This paper outlines several different pattern-recognition approaches. Hence, the term MSET as used in this specification can refer to (among other things) any technique outlined in [Gribok], including: ordinary least squares (OLS), support vector machines (SVM), artificial neural networks (ANNs), MSET, or regularized MSET (RMSET).

Alarm-generation mechanism 116 can be any device that can receive input from pattern-recognition model mechanism 114 and/or current-voltage monitor 112, and generate an alarm in accordance with embodiments of the present invention. In some embodiments, alarm-generation mechanism 116 generates an alarm based an analysis of the output of pattern-recognition model mechanism 114 using one or more of the following: a sequential hypothesis test such as a sequential probability ratio test (SPRT), or any other test to characterize computer system 100 based on the output from pattern-recognition model mechanism 114. Note that alarm-generation mechanism 116 can be implemented in any combination of hardware and software. In some embodiments, alarm-generation mechanism 116 operates on computer system 100. In other embodiments, alarm-generation mechanism 116 operates on one or more service processors. In still other embodiments, alarm-generation mechanism 116 is located inside computer system 100. In yet other embodiments, alarm-generation mechanism 116 operates on a separate computer system.

In some embodiments, one or more of current-voltage monitor 112, pattern-recognition model mechanism 114, and alarm-generation mechanism 116 operate on a remote computer system. These mechanisms can communicate through network connections, including the Internet that can include one or more wired and/or wireless links.

Some embodiments of the present invention operate as follows. During operation, communication system 102 transmits information through optical fiber 108 using the output of solid-state light source 104. While communication system 102 operates, current-voltage monitor 112 monitors the I-V relationship of solid-state light source 104, and the monitored I-V relationship is input into pattern-recognition model mechanism 114. Pattern-recognition model mechanism 114 implements a pattern-recognition model to characterize the health of solid-state light source 104. Note that the training of the pattern-recognition model will be discussed below.

In some embodiments, pattern-recognition model mechanism 114 implements an MSET pattern-recognition model, and the I-V relationship of solid-state light source 104 is input into the pattern-recognition model implemented by pattern-recognition model mechanism 114 to generate an estimate of the I-V relationship. A residual is generated from the difference between the monitored I-V relationship and the estimated I-V relationship.

The residuals are transmitted to alarm-generation mechanism 116. In some embodiments, alarm-generation mechanism 116 implements a statistical hypothesis test on the residuals which can include but is not limited to a sequential probability ratio test (SPRT). In some embodiments, SPRT is applied to one or more of the mean, slope or variance of the residuals to detect changes in the I-V relationship of solid-state light source 106. Alarm-generation mechanism 116 then generates alarms based on the results of the SPRT of the residuals.

Additionally, in some embodiments as will be discussed below, information on the cause of change or degradation in performance of solid-state light source 104 is determined by alarm generation mechanism 116 based on the I-V relationship received from current-voltage monitor 112. Changes in the I-V relationship may depend on factors including but not limited to one or more of: the type of device the solid-state light source is (e.g., VCSEL, DFB, LED), the manufacturer of the solid-state light source, the cause of the change in the behavior, the details of power source 106, and the portion of the I-V relationship for solid-state light source being analyzed (e.g., forward bias, reverse bias, pre-threshold, post-threshold).

In some embodiments, when an alarm is generated, alarm-generation mechanism 116 additionally determines the cause of the change or degradation in the performance of solid-state light source 104 and estimates the remaining useful life. Alarm-generation mechanism 116 may also initiate one or more of the following actions: scheduling a service action for solid-state light source 104, notifying a computer system operator of the alarm, notifying computer system 100 of the alarm, and/or recommending that communication system 102 alter the operation of solid-state light source 104 based on one or more of the cause of the change in behavior and the expected remaining life of solid-state light source 104.

We now turn to the training of the patter-recognition model implemented by pattern-recognition model mechanism 114. In some embodiments, the pattern-recognition model is trained as follows. A training data set is generated by monitoring the I-V relationships for one or more correctly functioning solid-state light sources and one or more solid state light sources with known problems that may affect their behavior, including but not limited to lifetime, output characteristics, or any other behavior that is desired to be characterized by characterization module 110. In some embodiments, the training data is generated based on the solid-state light source that will be characterized by the pattern-recognition model being trained and the configuration in which it will be used. Therefore, in some embodiments, the training data is generated using the same: type of solid-state light source, manufacturer, power source, and any other relevant parameter that may impact the training and/or operation of the pattern-recognition model in characterizing the solid-state light source. Note that the training data can be generated using one or more portions of the I-V relationship (e.g., forward bias, reverse bias, pre-threshold, post-threshold). The training data is then used to train the pattern-recognition model. Additionally in some embodiments, the pattern-recognition model and the statistical hypothesis test are applied to the test data to train the system, including alarm generation mechanism 116, to identify the causes of problems that may affect the behavior, and/or the estimated useful lifetime of the solid-state light source.

FIGS. 2-4 depict exemplary graphs of current-voltage relationships and light output versus voltage and versus current for a properly functioning solid-state light source compared to degraded solid-state light source for different causes of the degradation. Note that using data similar to that in FIGS. 2-4, the pattern-recognition model in pattern-recognition model mechanism 114, and alarm generation mechanism 116 can be trained to: generate an alarm based on identifying a degradation in performance of solid-state light source 104, identify the cause of the degradation, and recommend one or more actions. We will discuss the changes in the I-V relationship based on the exemplary graphs of FIGS. 2-4 and how alarm generation mechanism can use information in the I-V relationship to determine a cause of the degradation. Note that the graphs in FIGS. 2-4 comprise only a few examples of data from degraded solid-state light sources that can be used to train the pattern-recognition model in pattern-recognition model mechanism 114 and alarm generation mechanism 116 in characterization module 110.

Figure 2A:
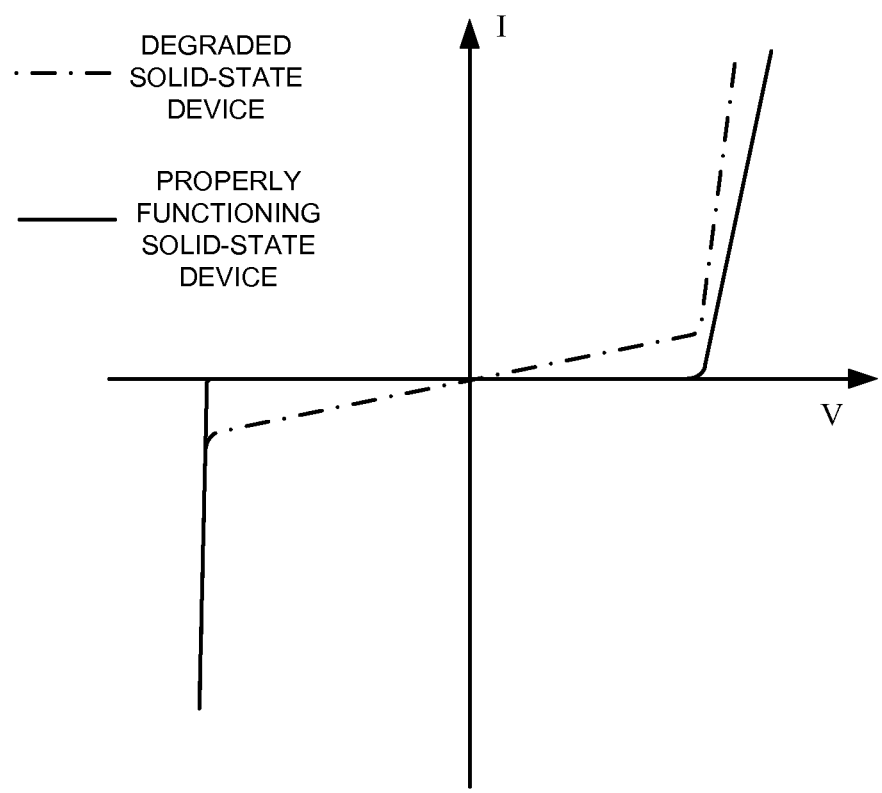
FIG. 2 depicts exemplary graphs of current-voltage relationships and light output versus voltage and versus current for a degraded solid-state light source with a shunt resistance across the device compared to a properly functioning solid-state light source.
Figure 2B:
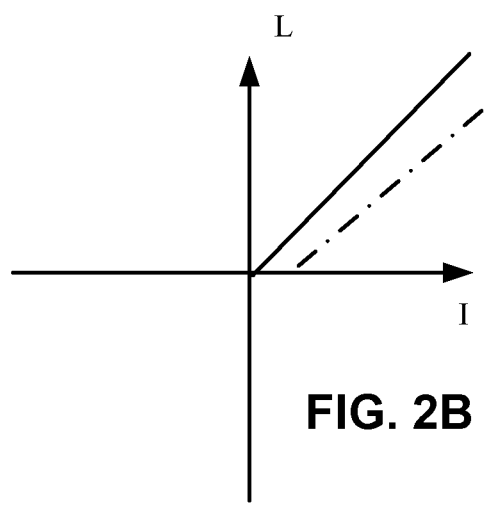
Figure 2C:
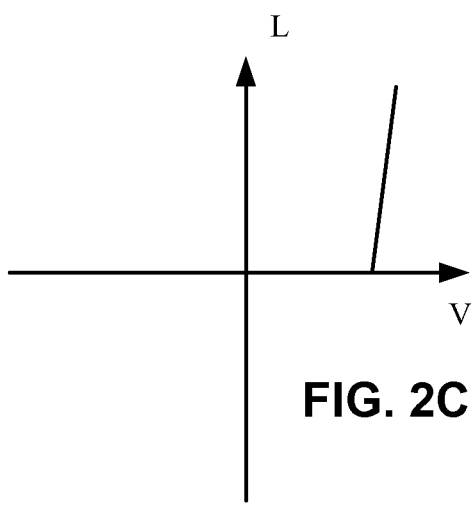

FIG. 2 depicts exemplary graphs of current-voltage relationships and light output versus voltage and versus current for a degraded solid-state light source with a shunt resistance across the device compared to a properly functioning solid-state light source. (Note that in the example of FIGS. 2-4, the solid-state light source may be an LED or a VCSEL.) The graphs in FIG. 2 representing the degraded device depict an example of the effects of a shunt resistance across the device due to, for example, humidity and condensation, ionic film growth, metal growth or deposition (from corrosion mechanisms), chemical attack of the surface of the device, or physical damage at the sides of the device. Note in FIG. 2A that after "turn-on," the slope for the degraded device is slightly higher than for the properly functioning device, while before breakdown the slope is related to the reciprocal of the shunt resistance. Thus, based on the slope of the I-V relationship after turn-on and before breakdown, the model can use data from the training data set to identify devices that includes shunt resistance. Also note that in FIG. 2B the light output versus current has a lower slope and outputs less light at a given current. Additionally, FIG. 2C depicts that the light output versus voltage is similar for the degraded and properly functioning solid-state devices.

FIG. 3 depicts exemplary graphs of current-voltage relationships and light output versus voltage and versus current for a degraded solid-state light source with a series resistance across the device compared to a properly functioning solid-state light source. The graphs in FIG. 3 representing the degraded device depict an example of the effects of a resistance in series with the device due to, for example, a defective wirebond or bondpad, corrosion of the wirebond or bondpad, a defect under the bondpad, a defective back contact, a defective die attached, or cracks or other damage to the semiconductor material. Note that in FIG. 3A, after turn-on, the slope for the degraded device is slightly lower that for the properly functioning device, while after breakdown the slope is related to the reciprocal of the series resistance. Also, as depicted in FIG. 3B, the light output versus current is similar for the degraded and properly functioning solid-state devices. As depicted in FIG. 3C, the slope of the light output versus voltage is lower for the degraded device than for the properly functioning device and the light output of the degraded device is lower at a given voltage.

FIG. 4 depicts exemplary graphs of current-voltage relationships and light output versus voltage and versus current for a degraded solid-state light source with a non-radiative defect in or near the p-n junction the device compared to a properly functioning solid-state light source. The graphs in FIG. 4 representing the degraded device depict an example of the effects of non-radiative or leakage defects near the p-n junction. Note in FIG. 4A that after turn-on, the slope for the degraded device is slightly lower than that for the properly functioning device while after breakdown there is a noticeable separation between the degraded device and the good device. Additionally, as depicted in FIGS. 4B and 4C, the light output versus current and versus voltage have a lower slope for the degraded device than for the properly function device and the light output is lower for a given current or a given voltage.

In some embodiments, after alarm generation mechanism 116 determines there is a problem in solid-state light source 104, alarm-generation mechanism 116 instructs power source 106 to access other portions of the I-V relationship for solid-state light source 104, including, for example the regions before and after breakdown. Using information from these regions of the I-V relationship, alarm-generation mechanism 116 determines one or more likely causes of the problems exhibited by solid-state light source 104.

Figure 5:
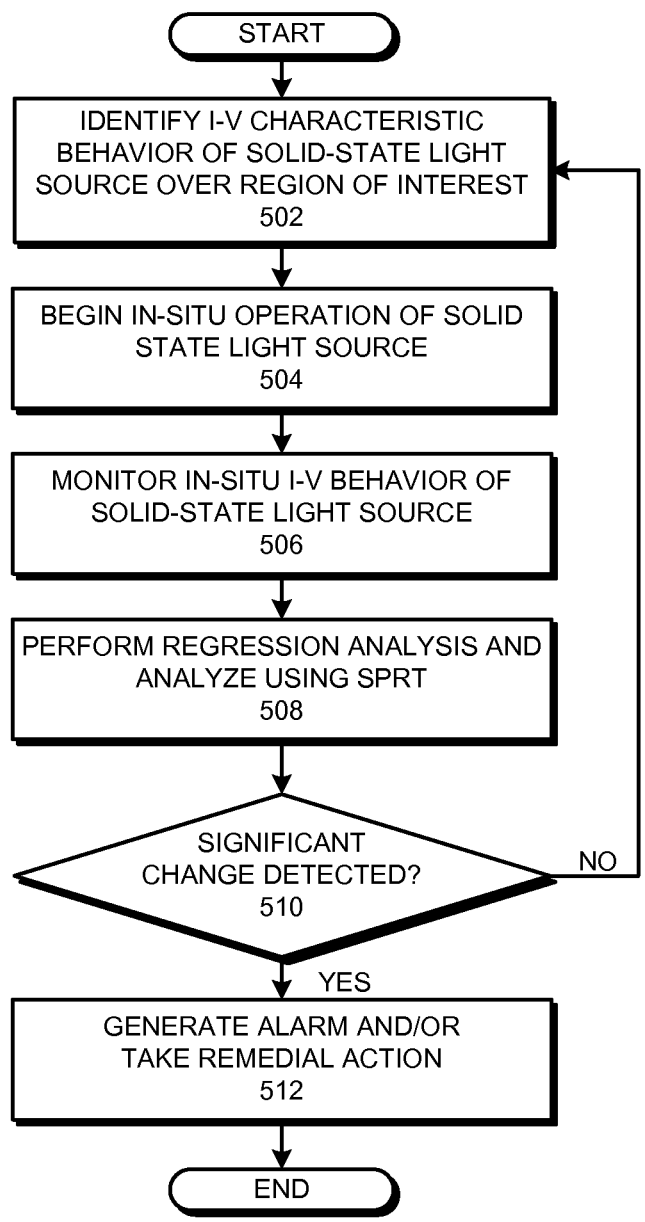
FIG. 5 presents a flowchart illustrating a process for in-situ characterization of a solid-state light source in accordance with some embodiments of the present invention.

FIG. 5 presents a flowchart illustrating a process for in-situ characterization of a solid-state light source in accordance with some embodiments of the present invention. First, the I-V characteristic behavior of a solid-state light source is identified over the region of interest (step 502). Then, in-situ operation of the solid-state light source begins (step 504). Next, the I-V relationship of the solid-state light source is monitored (step 506). Regression analysis of the solid-state light source is performed using a pattern-recognition model and the residuals from the model are analyzed using a statistical hypothesis test such as SPRT (step 508). If no significant change in the I-V relationship is detected (step 510), then the process returns to step 502. If a significant change in the I-V relationship for het solid-state light source is detected (step (510), then an alarm is generated and/or remedial action is taken (step 512).

Figure 6:
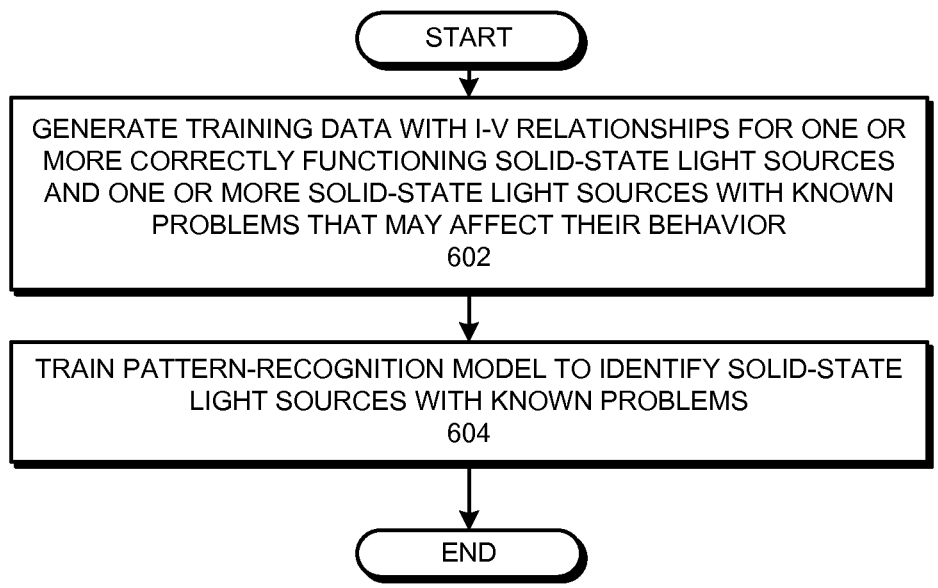
FIG. 6 presents a flowchart illustrating a process for training a pattern-recognition model in accordance with some embodiments of the present invention.

FIG. 6 presents a flowchart illustrating a process for training a pattern-recognition model in accordance with some embodiments of the present invention. First, training data is generated that includes the I-V relationship for one or more correctly functioning solid-state light sources and one or more solid-state light sources with known problems that may affect their behavior (step 602). Then, the pattern-recognition model is trained to identify the solid-state light sources with known problems (step 604).

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method for in-situ characterization of a single solid-state light source, the method comprising, in at least one computer:
    identifying a current-voltage characteristic behavior of the single solid-state light source over a region of interest within a current-voltage relationship of the single solid-state light source, wherein the single solid-state light source is a vertical-cavity surface-emitting laser (VCSEL);
    monitoring a voltage and a current of the single solid-state light source during an in-situ operation of the single solid-state light source;
    characterizing the health of the single solid-state light source based on an analysis that involves a regression analysis that generates an estimate of a current-voltage relationship for the single solid-state light source based on a relationship of the monitored voltage and current, wherein characterizing the health of the single solid-state light source includes characterizing a likelihood of an impending failure of the single solid-state light source;
    generating an alarm when a result of a sequential hypothesis test of one or more residuals computed from the regression analysis indicate that the health of the single solid-state light source is degraded, wherein said generating the alarm involves determining a cause of degradation from a plurality of possible causes of degradation based on the relationship of the monitored voltage and current of the single solid-state light source during the in-situ operation of the single solid-state light source; and
    taking remedial action when the health of the single solid-state light source is degraded.

2. The method of claim 1, wherein the regression analysis involves a nonlinear, non-parametric regression analysis of the monitored voltage and current.

3. The method of claim 2, wherein the nonlinear, non-parametric regression analysis includes the use of a multivariate state estimation technique.

4. The method of claim 1, wherein the regression analysis includes a statistical hypothesis test of the regression analysis.

5. The method of claim 1, wherein the remedial action involves replacing the single solid-state light source.

6. The method of claim 1, wherein the remedial action involves determining a cause of a failure of the single solid-state light source.

7. The method of claim 1, wherein the sequential hypothesis test includes a sequential probability ratio test (SPRT).

8. A non-transitory computer-readable storage medium storing instructions that when executed by a computer cause the computer to perform a method for in-situ characterization of a single solid-state light source, the method comprising:
    identifying a current-voltage characteristic behavior of the single solid-state light source over a region of interest within a current-voltage relationship of the single solid-state light source, wherein the single solid-state light source is a vertical-cavity surface-emitting laser (VCSEL);
    monitoring a voltage and a current of the single solid-state light source during an in-situ operation of the single solid-state light source;
    characterizing the health of the solid-state light source based on an analysis that involves a regression analysis that generates an estimate of a current-voltage relationship for the single solid-state light source based on a relationship of the monitored voltage and current, wherein characterizing the health of the single solid-state light source includes characterizing a likelihood of an impending failure of the single solid-state light source;
    generating an alarm when a result of a sequential hypothesis test of one or more residuals computed from the regression analysis indicate that the health of the single solid-state light source is degraded, wherein said generating the alarm involves determining a cause of degradation from a plurality of possible causes of degradation based on the relationship of the monitored voltage and current of the single solid-state light source during the in-situ operation of the single solid-state light source; and
    taking remedial action when the health of the single solid-state light source is degraded.

9. The computer-readable storage medium of claim 8, wherein the regression analysis involves a nonlinear, non-parametric regression analysis of the monitored voltage and current.

10. The computer-readable storage medium of claim 9, wherein the nonlinear, non-parametric regression analysis includes the use of a multivariate state estimation technique.

11. The computer-readable storage medium of claim 8, wherein the regression analysis includes a statistical hypothesis test of the regression analysis.

12. The computer-readable storage medium of claim 8, wherein the remedial action involves replacing the single solid-state light source.

13. The computer-readable storage medium of claim 8, wherein the remedial action involves determining a cause of a failure of the single solid-state light source.

14. An apparatus that characterizes a single solid-state light source in-situ, the apparatus comprising:
- identifying a current-voltage characteristic behavior of the single solid-state light source over a region of interest within a current-voltage relationship of the single solid-state light source, wherein the single solid-state light source is a vertical-cavity surface-emitting laser (VCSEL);
- a monitoring mechanism configured to monitor a voltage and a current of the single solid-state light source during an in-situ operation of the single solid-state light source;
- a characterizing mechanism configured to characterize the health of the single solid-state light source based on an analysis of the monitored voltage and current, wherein the analysis involves a nonlinear, non-parametric regression analysis that generates an estimate of a current-voltage relationship for the single solid-state light source based on a relationship of the monitored voltage and current, and wherein characterizing the health of the single solid-state light source includes characterizing a likelihood of an impending failure of the single solid-state light source; and
- wherein the characterizing mechanism is further configured to generate an alarm when a result of a sequential hypothesis test of one or more residuals computed from the regression analysis indicate that the health of the single solid-state light source is degraded, wherein said generating the alarm involves determining a cause of degradation from a plurality of possible causes of degradation based on the relationship of the monitored voltage and current of the single solid-state light source during the in-situ operation of the single solid-state light source.

* * * * *